United States Patent
Patil et al.

(10) Patent No.: US 10,218,360 B2
(45) Date of Patent: Feb. 26, 2019

(54) DYNAMIC CLOCK-DATA PHASE ALIGNMENT IN A SOURCE SYNCHRONOUS INTERFACE CIRCUIT

(71) Applicant: Altera Corporation, San Jose, CA (US)

(72) Inventors: Dinesh Patil, Sunnyvale, CA (US); Kok Hong Chan, Bayan Lepas (MY); Wai Tat Wong, Bukit Mertajam (MY); Chuan Thim Khor, Teluk Intan (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/226,037

(22) Filed: Aug. 2, 2016

(65) Prior Publication Data
US 2018/0041328 A1   Feb. 8, 2018

(51) Int. Cl.
| | | |
|---|---|---|
| *H03K 19/177* | (2006.01) | |
| *G06F 1/04* | (2006.01) | |
| *H03L 7/08* | (2006.01) | |
| *H03L 7/081* | (2006.01) | |
| *H04L 12/875* | (2013.01) | |

(Continued)

(52) U.S. Cl.
CPC .......... *H03K 19/1776* (2013.01); *G06F 1/04* (2013.01); *G06F 1/12* (2013.01); *H03K 19/17728* (2013.01); *H03L 7/0805* (2013.01); *H03L 7/0814* (2013.01); *H04L 47/56* (2013.01); *G11C 7/222* (2013.01)

(58) Field of Classification Search
None
See application file for complete search history.

(56) References Cited

U.S. PATENT DOCUMENTS

| | | | | |
|---|---|---|---|---|
| 5,509,037 A | * | 4/1996 | Buckner | ............... H04L 7/0338 |
| | | | | 327/152 |
| 5,617,452 A | * | 4/1997 | Haulin | ...................... G06F 1/10 |
| | | | | 327/264 |

(Continued)

OTHER PUBLICATIONS

International Search Report and Written Opinion for PCT Patent Application No. PCT/US17/40999, dated Oct. 13, 2017, 17 pages.

*Primary Examiner* — Berhanu Tadese
(74) *Attorney, Agent, or Firm* — Compass IP Law PC

(57) ABSTRACT

The present embodiments relate to clock-data phase alignment circuitry in source-synchronous interface circuits. Source-synchronous interface standards require the transmission and reception of a clock signal that is transmitted separately from the data signal. On the receiver side, the clock signal must be phase shifted relative to the data signal to enable the capture of the data. Clock-data phase alignment circuitry is presented that may receive a differential clock with complementary clock signals CLK_P and CLK_N. An adjustable delay circuit and clock distribution network may delay clock signal CLK_P and provide the delayed clock signal to a storage circuit that may store the data signal. A replica clock distribution network and a replica adjustable delay circuit may form a feedback path and provide the delayed first clock signal back to clock phase adjustment circuitry which may control the adjustment of the adjustable delay circuit and the replica adjustable delay circuit.

20 Claims, 8 Drawing Sheets

(51) Int. Cl.
*G06F 1/12* (2006.01)
*G11C 7/22* (2006.01)

(56) References Cited

U.S. PATENT DOCUMENTS

| | | | | |
|---|---|---|---|---|
| 5,889,436 A * | 3/1999 | Yeung | H03L 7/081 | 331/14 |
| 6,075,832 A * | 6/2000 | Geannopoulos | G06F 1/10 | 327/149 |
| 6,232,806 B1 * | 5/2001 | Woeste | G06F 1/10 | 327/149 |
| 6,396,887 B1 * | 5/2002 | Ware | G06F 1/12 | 327/144 |
| 6,622,255 B1 * | 9/2003 | Kurd | G06F 1/10 | 713/401 |
| 6,630,855 B2 * | 10/2003 | Fayneh | G06F 1/10 | 327/291 |
| 7,034,597 B1 * | 4/2006 | Mo | H03L 7/0814 | 327/276 |
| 7,046,174 B1 * | 5/2006 | Lui | H03K 5/135 | 341/100 |
| 7,075,365 B1 * | 7/2006 | Starr | G06F 1/10 | 327/297 |
| 7,295,641 B1 * | 11/2007 | Wortman | H04L 7/0337 | 370/324 |
| 7,340,021 B1 * | 3/2008 | Churchill | H04L 7/0338 | 375/326 |
| 7,486,702 B1 * | 2/2009 | Yang | G11C 7/02 | 370/518 |
| 7,493,461 B1 * | 2/2009 | Thorne | G11C 29/02 | 326/93 |
| 7,515,664 B1 * | 4/2009 | Yeoh | H04L 7/0083 | 327/141 |
| 7,545,196 B1 * | 6/2009 | Hutton | G06F 1/10 | 327/291 |
| 7,555,667 B1 * | 6/2009 | Burney | G06F 1/12 | 713/401 |
| 7,590,211 B1 * | 9/2009 | Burney | H03L 7/0995 | 375/376 |
| 7,644,296 B1 * | 1/2010 | Burney | H03L 7/0814 | 713/401 |
| 7,664,978 B2 * | 2/2010 | Burney | G06F 1/10 | 711/100 |
| 7,715,467 B1 * | 5/2010 | Burney | H03M 9/00 | 375/219 |
| 7,839,966 B1 * | 11/2010 | Masepohl | H04J 3/0685 | 375/371 |
| 8,115,512 B1 * | 2/2012 | O'Dwyer | H03M 9/00 | 326/40 |
| 8,149,038 B1 * | 4/2012 | Sung | H03L 7/0814 | 327/158 |
| 8,643,414 B1 * | 2/2014 | Navid | H03L 7/10 | 327/147 |
| 8,847,626 B1 * | 9/2014 | Chong | H03K 19/1737 | 326/21 |
| 8,860,475 B1 * | 10/2014 | Yeoh | H03L 7/0814 | 327/150 |
| 9,432,025 B1 * | 8/2016 | Khor | H03L 1/00 | |
| 9,503,057 B1 * | 11/2016 | Venkata | H03K 3/01 | |
| 2001/0038674 A1 * | 11/2001 | Trans | H04B 1/00 | 375/355 |
| 2005/0259775 A1 * | 11/2005 | Chang | H03L 7/0814 | 375/355 |
| 2005/0262373 A1 * | 11/2005 | Kim | H03L 7/0814 | 713/401 |
| 2006/0188050 A1 * | 8/2006 | Jenkins | G06F 1/10 | 375/371 |
| 2006/0262891 A1 * | 11/2006 | Faulkner | H03L 7/00 | 375/371 |
| 2007/0230513 A1 * | 10/2007 | Talbot | H04L 7/0337 | 370/516 |
| 2008/0054959 A1 * | 3/2008 | Fujisawa | H03L 7/0812 | 327/149 |
| 2008/0062780 A1 * | 3/2008 | Cheng | G11C 7/22 | 365/193 |
| 2008/0263381 A1 * | 10/2008 | Khor | H04L 7/0004 | 713/500 |
| 2010/0289544 A1 * | 11/2010 | Lee | H04L 7/0062 | 327/159 |
| 2011/0291719 A1 * | 12/2011 | Ok | H03L 7/0805 | 327/158 |
| 2012/0223754 A1 * | 9/2012 | Lewis | H03K 5/13 | 327/158 |
| 2012/0250811 A1 * | 10/2012 | Misek | H04L 7/0337 | 375/371 |
| 2012/0314721 A1 * | 12/2012 | Bulzacchelli | H04L 7/10 | 370/503 |
| 2013/0033946 A1 * | 2/2013 | Ware | G06F 13/1689 | 365/193 |
| 2013/0148447 A1 * | 6/2013 | Shaeffer | G11C 5/14 | 365/189.17 |
| 2013/0249612 A1 * | 9/2013 | Zerbe | H04L 7/0079 | 327/161 |
| 2014/0195728 A1 * | 7/2014 | Hsu | G06F 12/0246 | 711/105 |
| 2014/0211571 A1 * | 7/2014 | Lee | G06F 13/1689 | 365/189.07 |
| 2014/0247683 A1 * | 9/2014 | Riho | G11C 11/4076 | 365/233.1 |
| 2015/0003574 A1 * | 1/2015 | Mozak | G11C 7/222 | 375/355 |
| 2016/0246325 A1 * | 8/2016 | Chalasani | H03K 19/0175 | |
| 2018/0041328 A1 * | 2/2018 | Patil | H03K 19/17728 | |

* cited by examiner

DYNAMIC CLOCK-DATA PHASE ALIGNMENT IN A SOURCE SYNCHRONOUS INTERFACE CIRCUIT

BACKGROUND

The present embodiments relate to integrated circuits and, more particularly, to dynamic clock-data phase alignment in a source-synchronous interface circuit.

Signal transmission and reception is the basis for communication between circuits within electronic devices as well as between circuits within different electronic devices. However, when building high-performance products, system developers face significant challenges in maintaining the precise timing and signal integrity required to reliably sustain high data rates. Differential signaling standards like low voltage differential signaling (LVDS) aid in this effort by providing common mode rejection, which greatly reduces the effects of electrical noise.

Clock-data recovery (CDR) transceiver implementations combine the clock and data into a single signal, thus ensuring simultaneous arrival at their destination. However, a number of interface standards such as DDR memory, HyperTransport buses, and the System Packet Interface (SPI) 4.2 standard are source-synchronous. Those source-synchronous interface standards require the transmission and reception of a clock signal that is transmitted separately from the data signal.

On the receiver side, the clock signal must be phase shifted relative to the data signal to enable the capture of the data. For example, edge-aligned clock and data signals must be phase shifted relative to each other by 90 degrees such that the edge of the clock signal is aligned with the center of the data signal, thereby enabling the storage of the data signal in a storage circuit that is triggered by an edge of the clock signal.

Dynamic phase alignment (DPA) technology has been developed to address the phase alignment in interfaces that require data ranges above 700 megabits per second (Mbps). The goal of dynamic phase alignment (DPA) is to allow devices to actively respond to changes in skew between the transmitted clock and data signals. Integrated circuits that are equipped with DPA continuously check the incoming data signal and adjust the phase of the clock signal to align with it. Several industry standards responsible for defining source synchronous interfaces, including System Packet Interface (SPI) 4.2, have recognized the value of DPA, and have included or recommended it in their specifications.

SUMMARY

Clock-data phase alignment circuitry may include clock phase adjustment circuitry, first and second clock distribution networks, and a storage circuit. The clock phase adjustment circuitry may receive a differential clock with first and second clock signals that are complementary to each other. The first clock distribution network may receive the first clock signal and propagate the first clock signal through at least one first clock buffer to provide a delayed first clock signal. The storage circuit may receive the delayed first clock signal and a data signal and store the data signal based on the delayed first clock signal, and a second clock distribution network coupled between the first clock distribution network and the clock phase adjustment circuitry may receive the delayed first clock signal and propagate the delayed first clock signal through at least one second clock buffer to provide a further delayed first clock signal to the clock phase adjustment circuitry.

It is appreciated that the embodiments described herein can be implemented in numerous ways, such as a process, an apparatus, a system, a device, or a method executed on a processing machine. Several inventive embodiments are described below.

In certain embodiments, the above mentioned clock-data phase alignment circuitry may replicate at least a branch of the first clock distribution network in the second clock distribution network, and each of the at least first and second clock buffers may have a delay of less than half a unit interval (UI).

If desired, the clock phase adjustment circuitry may further include a first adjustable delay circuit that delays the first clock signal by a first adjusted delay and a second adjustable delay circuit that delays the further delayed first clock signal by a second adjusted delay to provide a feedback clock signal.

In some embodiments, the above mentioned clock phase adjustment circuitry may further include a phase detector, a delay control circuit, and/or a register. The phase detector may provide a control signal based on a phase difference between the second clock signal and the feedback clock signal, the delay control circuit may adjust the first and second adjusted delays of the first and second adjustable delay circuits, respectively, based on the control signal, and the register may provide the control signal by storing the second clock signal based on the feedback signal.

Further features of the invention, its nature and various advantages, will be apparent from the accompanying drawings and the following detailed description of the preferred embodiments.

DETAILED DESCRIPTION

The present embodiments provided herein relate to integrated circuits and, more particularly, to dynamic clock-data phase alignment in a source-synchronous interface circuit.

Source-synchronous interface standards require the transmission and reception of a clock signal that is transmitted separately from the data signal. On the receiver side, the clock signal must be phase shifted relative to the data signal to enable the capture of the data. For example, edge-aligned clock and data signals are preferably phase shifted relative to each other by 90 degrees such that the edge of the clock signal is aligned with the center of the data signal, thereby sampling the data signal in a storage circuit at an edge of the clock signal.

Some implementations use the clock signal of the source-synchronous interface to clock input capture registers directly. In other implementations, the clock signal drives a delay-locked loop (DLL) circuit or a phase-locked loop (PLL) circuit that clocks the input capture registers. There are usually larger timing margins for interfaces that use a DLL or a PLL to clock the input capture registers than there are for interfaces that use the clock signal directly to clock the capture registers, especially with an increasing size of data bits that are transmitted in parallel and have to be captured in parallel. Such larger buses often require a DLL and a quadrature clock generator, both of which are costly in power and area.

Consequently, it is desirable to provide clock-data phase alignment circuitry that is capable of aligning the clock and data signals using less power and area than the above mentioned alternative of using a DLL and a quadrature clock generator while still supporting a large data bus.

It will be recognized by one skilled in the art, that the present exemplary embodiments may be practiced without some or all of these specific details. In other instances, well-known operations have not been described in detail in order not to unnecessarily obscure the present embodiments.

Figure 1:
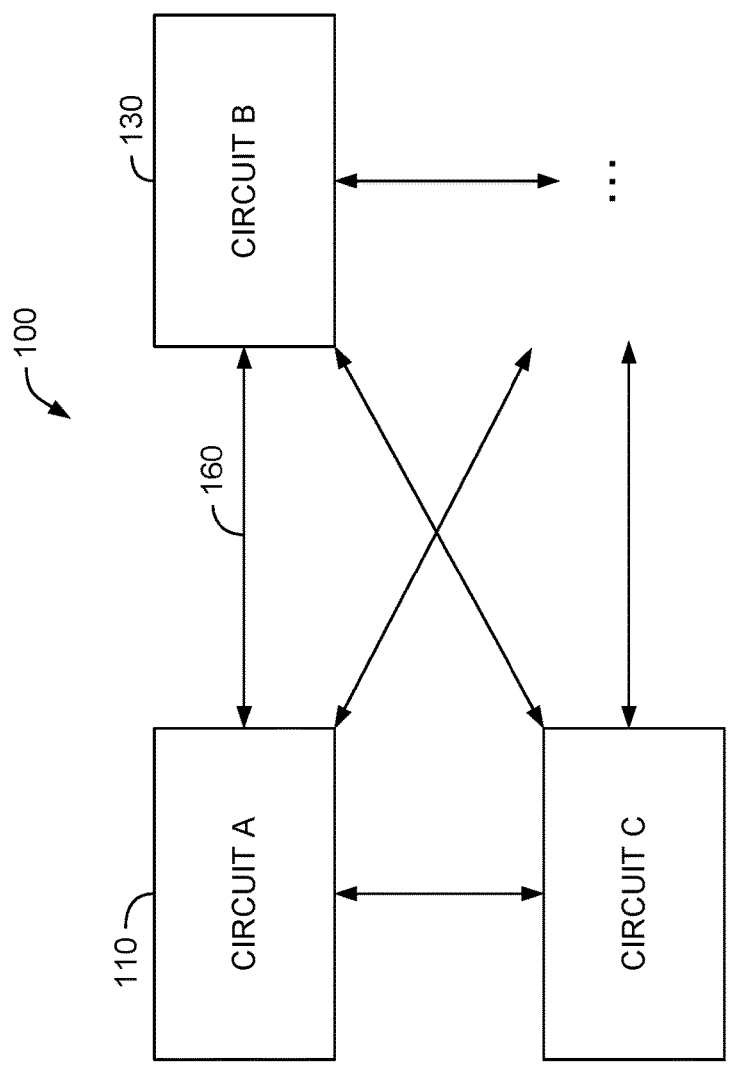
FIG. 1 is a diagram of an illustrative system of interconnected circuits in accordance with an embodiment.

An illustrative embodiment 100 of interconnected circuits is shown in FIG. 1. The system of interconnected circuits has one or more circuits such as circuit A 110 and circuit B 130 and interconnection resources 160. The circuits may be any suitable type of circuits that communicate with other circuits. Examples of such circuits include analog circuits, digital circuits, mixed-signal circuits. The circuits may be arranged on the same die, on different dies in the same package, on different dies in different packages, whereby the different packages may be implemented on a same printed-circuit board (PCB), on different PCBs in the same device or in different devices and/or systems.

Examples of such circuits also include complex electronic systems such as network routers and cell phone base stations or parts thereof that communicate with each other over wired or wireless networks. Interconnection resources 160 such as conductive lines and busses, optical interconnect infrastructure, or wired and wireless networks with optional intermediate switches may be used to send signals from one circuit to another circuit or to broadcast information from one circuit to multiple other circuits.

Interconnection resources 160 may transport signals serially or in parallel or using a combination of serial-parallel data transmission, if desired. For example, interconnection resources 160 may implement a 100 gigabit per second (Gbps) connection between circuit A (110) and circuit B (130) using four serial connections of 25 Gbps each.

The signals that are transported over interconnection resources 160 may have the clock and data signals combined in a single signal. For example, a transmitting circuit (e.g., circuit A (110)) may serialize a data signal based on a clock signal and send the serialized data signal over interconnection resources 160 to a receiving circuit (e.g., circuit B (130)), and the receiving circuit may analyze the serialized data to recover a clock signal.

If desired, a transmitting circuit (e.g., circuit A (110)) may send the clock and data signals as separate signals over interconnection resources 160, and the receiving circuit (e.g., circuit B (130)) may ensure a predetermined phase shift between the clock and data signals, thereby implementing a source-synchronous interface standard.

Figure 2:
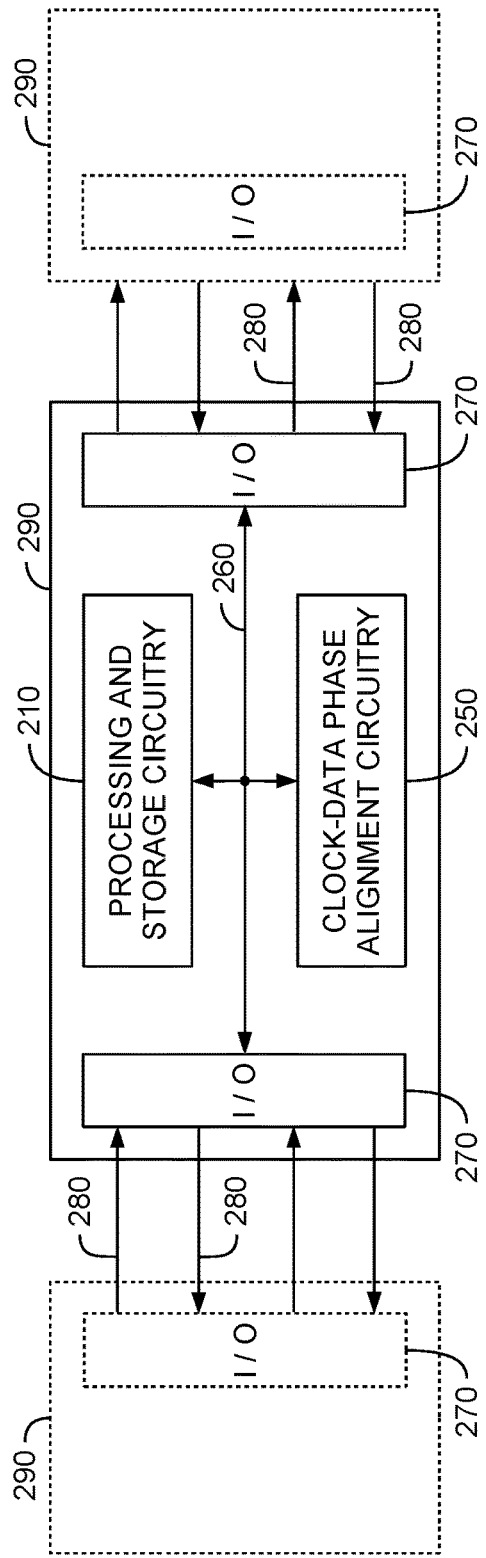
FIG. 2 is a diagram of an illustrative integrated circuit with clock-data phase alignment circuitry in accordance with an embodiment.

FIG. 2 shows an illustrative embodiment of a system 200 of circuits 290 that communicate with each other via a source synchronous interface. In the example of FIG. 2, circuits 290 are integrated circuits. However, this example is merely illustrative. Circuits 290 may be any desired circuits such as circuits 110 and/or 130 of FIG. 1.

Integrated circuits 290 may include processing and storage components 210 such as random-access memory (RAM), first-in first-out (FIFO) circuitry, stack or last-in first-out (LIFO) circuitry, read-only memory (ROM), content addressable memory (CAM), or other memory elements, embedded microprocessors, digital signal processors (DSP), microcontrollers, or other processing circuitry, clock-data phase alignment circuitry 250, and interconnection resources 260 such as conductive lines and busses.

Interconnection resources 260 may be used to send signals from one component to another component or to broadcast signals from one component to one or more other components. For example, interconnection resources 260 may be used to distribute a clock signal from the clock-data phase alignment circuitry 250 to some or all of the components in the integrated circuit.

Integrated circuit may include input/output circuitry 270 which may include parallel input/output circuitry, differential input/output circuitry, serial data transceiver circuitry, or any other desired input/output circuitry. Input/output circuitry 270 may be used for transmitting and receiving signals over interconnection resources 280 when communicating with other circuits.

For example, integrated circuit 290 may transmit serialized data signals at a given transmission rate to another integrated circuit over interconnection resources 280 using input/output circuitry 270. If desired, parallel data signals may be transmitted using input/output circuitry 270. As an example, a plurality of data signals may be transmitted in parallel and in parallel with a differential clock signal that includes positive and negative clock signals that are complementary relative to each other. In this example, clock-data phase alignment circuitry 250 of the signal receiving integrated circuit may ensure a predetermined phase shift between the clock and data signals to allow for the sampling of the data signal in the signal receiving integrated circuit.

Figure 3:
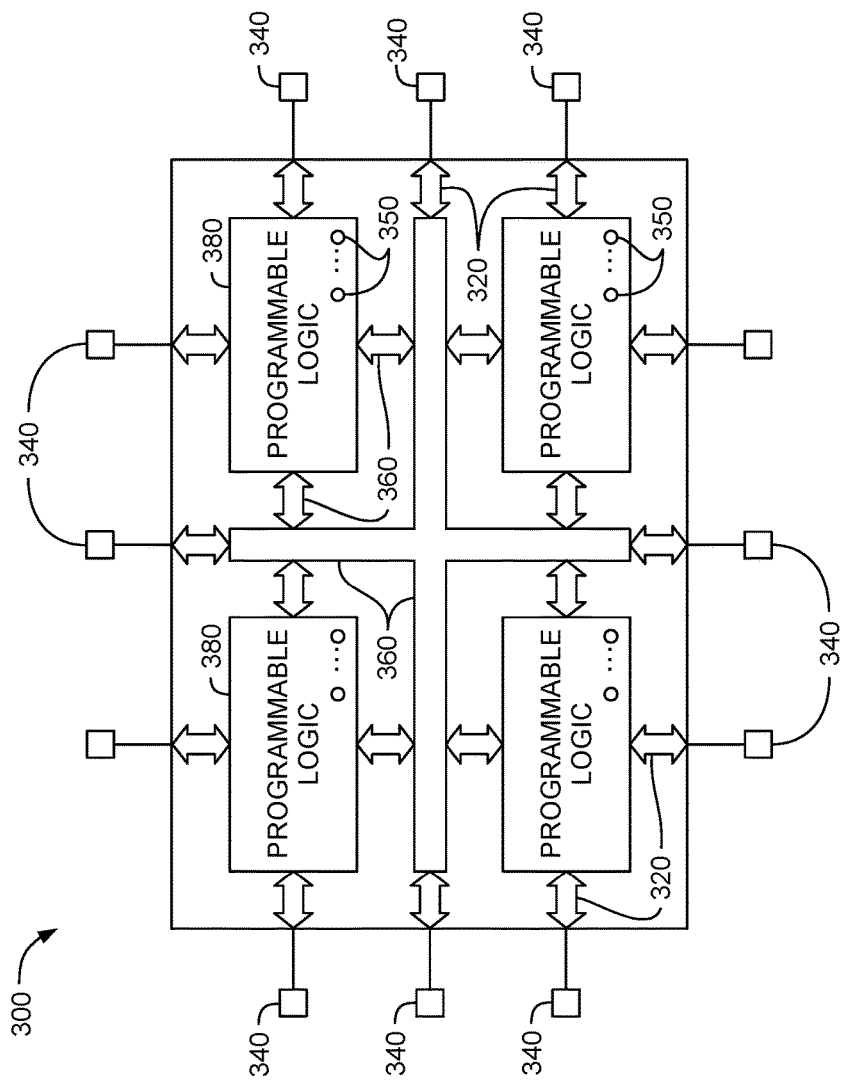
FIG. 3 is a diagram of an illustrative programmable integrated circuit in accordance with an embodiment.

Integrated circuit 290 may be programmable such as integrated circuit 300 shown in FIG. 3. As shown, integrated circuit 300 may have input-output (I/O) circuitry 320 for driving signals off of integrated circuit 300 and for receiving signals from other circuits via input-output pins 340.

Input-output circuitry 320 may include general-purpose input-output (GPIO) circuitry, which may be configured to be an input or an output. If desired, input-output circuitry 320 may include interface circuitry that accommodates communications using different protocols and/or standards. Protocols and standards that may be implemented using input-output circuitry 320 may include network standards and protocols such as low-voltage differential signaling (LVDS), Interlaken, Peripheral Component Interconnect Express (PCIe), Ethernet, gigabit Ethernet (GigE) such as the 10 Gigabit Attachment Unit Interface (XAUI), Hyper-Transport, System Packet Interface (SPI) 4.2, or other communications network standards or protocols. Memory standards such as double-data-rate (DDR) memory standards may be implemented using input-output circuitry 320. These examples are merely illustrative. If desired, any suitable interface and any number of desired interfaces for communicating with external circuitry may be implemented using input-output circuitry 320. Input-output circuitry 320 may be coupled to corresponding input-output pins 340.

Interconnection resources 360 such as global and local vertical, horizontal, and diagonal conductive lines and buses may be used to route signals on integrated circuit 300. Interconnection resources 360 may include fixed interconnects such as conductive lines. If desired, interconnection resources 360 may include programmable interconnects (i.e., programmable connections between respective fixed interconnects). Interconnection resources 360 may sometimes be referred to herein as interconnect resources or interconnects (e.g., interconnects formed from combinations of fixed interconnects and programmable interconnects).

Interconnects 360 may be used to couple circuitry in the integrated circuit. For example, interconnects 360 may interconnect regions of programmable logic such as programmable logic regions 380. Programmable logic regions 380 may sometimes be referred to as logic array blocks (LABs) or programmable circuit regions. Programmable logic regions 380, may, if desired, contain groups of smaller logic regions. These smaller logic regions, which may sometimes be referred to as logic elements (LEs), adaptive logic modules (ALMs), or configurable logic blocks (CLBs) may be interconnected using local interconnection resources.

Programmable logic regions 380 may include combinational and sequential logic circuitry. For example, programmable logic regions 380 may include look-up tables, logic gates (e.g., logic AND gates, logic OR gates, logic exclusive OR gates, inverter gates, etc.), synchronous circuitry (e.g., registers or flip-flops, latches, random-access memory (RAM), read-only memory (ROM), shift register logic (SRL), first-in first-out (FIFO) circuits, stacks or last-in first-out (LIFO) circuits, etc.), arithmetic operators (e.g., adders, multipliers, etc.), and multiplexers. Programmable logic regions 380 may be configured to perform a custom logic function.

Programmable logic regions 380 may contain programmable elements 350. Programmable elements 350 are sometimes also referred to as configuration RAM (CRAM) cells, configuration memory, memory cells, configuration cells, or configuration elements. Programmable elements 350 may be based on any suitable programmable technology, which may be volatile or non-volatile, such as fuses, antifuses, electrically-programmable read-only-memory technology, random-access memory cells, mask-programmed elements, optically programmable electron spin memory, etc. As an example, programmable elements 350 may be formed from memory cells.

During programming, configuration data may be loaded into programmable elements 350 using input-output pins 340 and input-output circuitry 320. As an example, consider the scenario in which programmable elements 350 are random-access memory (RAM) cells. In this scenario, the RAM cells may store the configuration data during write access operations (e.g., as part of a boot procedure that integrated circuit 300 may perform during power-up, as part of partial reconfiguration of integrated circuit 300, etc.).

Programmable elements 350 may provide static control output signals for controlling the state of logic components in programmable logic 380. In certain embodiments, the output signals generated by programmable elements 350 may be applied to gates of metal-oxide-semiconductor (MOS) transistors. For example, the static control output signals may control pass gate transistors. These pass gate transistors may form a multiplexer in the programmable interconnect of interconnect resources 360. Thus, controlling the gates of the pass gate transistors may contribute to implementing a routing path in interconnect resources 360 between two circuits that are located in programmable logic regions 380.

In some scenarios, programmable elements 350 may provide static data output signals for programmable circuitry. For example, look-up tables may include programmable elements 350 that produce static data output signals. In this scenario, control signals may configure the look-up tables to provide the static data output signals at look-up table outputs based on the look-up table inputs.

The circuitry of integrated circuit 300 may be organized using any suitable architecture. As an example, programmable logic 380 of integrated circuit 300 may be organized in a series of rows and columns of programmable logic regions, each of which may contain multiple smaller programmable logic regions.

The logic resources of integrated circuit 300 may be interconnected by interconnection resources 360 such as associated vertical, horizontal, diagonal, and through-silicon-via (TSV) conductors. These conductors may include global conductive lines that span substantially all of integrated circuit 300, fractional global lines such as half-lines or quarter lines that span part of integrated circuit 300, staggered lines of a particular length (e.g., sufficient to interconnect a predetermined number of resources in programmable logic regions 380 or a sufficient to interconnect a predetermined number of programmable logic regions 380, etc.), smaller local lines, or any other suitable interconnection resource arrangement.

If desired, the programmable logic regions 380 of integrated circuit 300 may be arranged in more levels or layers in which multiple logic regions are interconnected to form still larger portions of logic regions. Other device arrangements may include programmable logic regions that are not arranged in rows and columns.

Integrated circuit 300 may be part of a data processing system that includes one or more of the following components: a processor, memory, I/O circuitry, and peripheral devices. The data processing system can be used in a wide variety of applications, such as computer networking, data networking, instrumentation, video processing, digital signal processing, or any suitable other application where the advantage of using an integrated circuit with programmable or re-programmable logic is desirable.

Integrated circuit 300 may be used to perform a variety of different logic functions. For example, integrated circuit 300 may be configured as a processor or controller that works in cooperation with a system processor. Integrated circuit 300 may also be used as an arbiter for arbitrating access to a shared resource in the data processing system. In yet another example, the integrated circuit 300 may be configured as an interface between a processor and one of the other components in the system. In one embodiment, the integrated circuit 300 may be one of the families of devices owned by the assignee.

In addition to the relatively large blocks of programmable logic that are shown in FIG. 3, integrated circuit 300 may also include some programmable logic associated with the programmable interconnects, memory, and input-output circuitry on integrated circuit 300. For example, input-output circuitry 320 may contain programmable input and output buffers, and interconnects 360 may be programmed to route signals to a desired destination.

For example, integrated circuit 300 may receive serialized data signals at a given transmission rate from another circuit over pins 340 and input/output circuitry 320, and/or integrated circuit 300 may receive parallel data signals at a given rate from another circuit using parallel input/output circuitry 320. In some scenarios, integrated circuit 300 may receive a differential clock signal in addition to the parallel data signals for the purpose of implementing a source synchronous interface in integrated circuit 300.

In such a scenario, integrated circuit 300 may implement clock-data phase alignment circuitry. For example, integrated circuit 300 may receive the clock and data signals with its input/output circuitry 320 from where the clock and data signals may be sent over interconnection resources 360 to clock-data phase alignment circuitry which may be implemented by programmable components in a programmable logic region 380. In some embodiments, integrated circuit 300 may include specialized circuitry for implementing at least a portion of the clock-data phase alignment circuitry The clock-data phase alignment circuitry may generate and maintain a predetermined phase shift between the clock and data signals at the arrival of the respective signals at storage circuitry to ensure successful sampling of the data signals.

The above example was described with the transmitting circuitry being located in another circuit. This other circuit may be any type of circuit such as one of circuits 110 and/or 130 of FIG. 1. Alternative embodiments may include having the transmitting and receiving circuitry within the same programmable logic region 380 or in different programmable logic regions 380 on the same integrated circuit 300.

Figure 4:
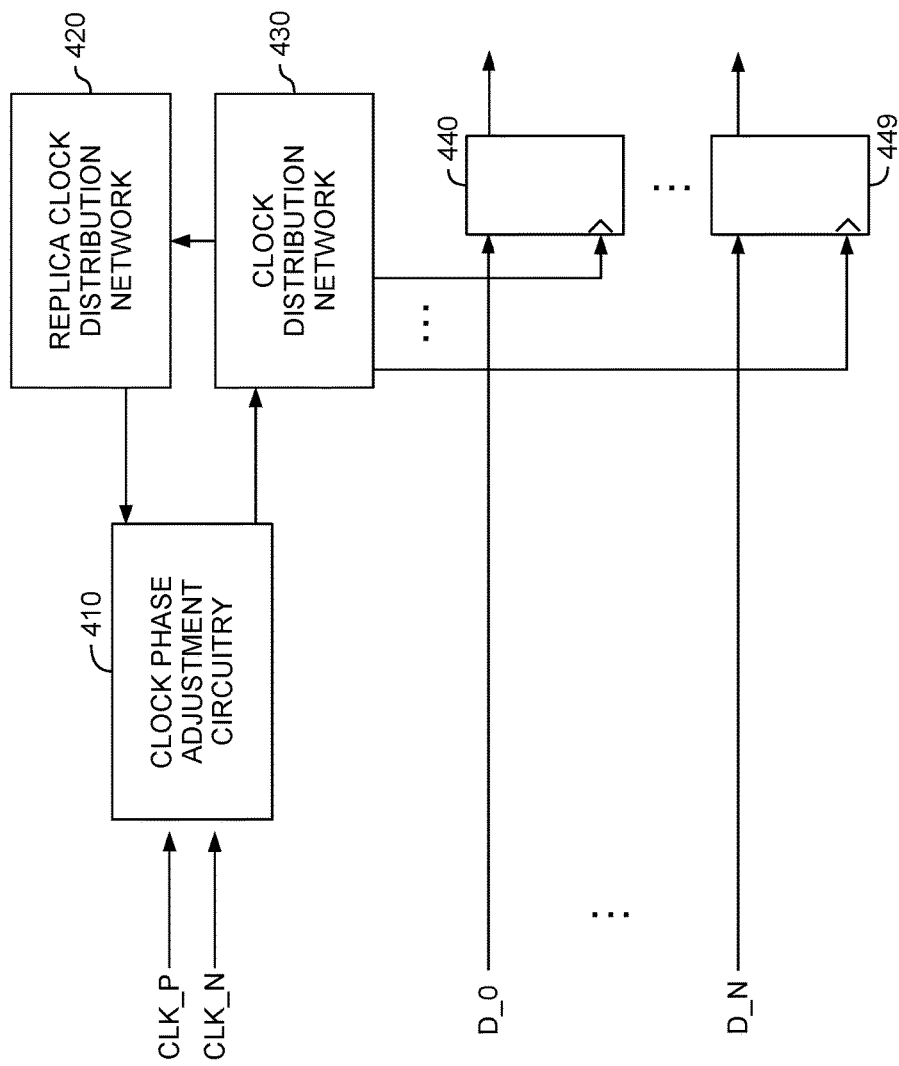
FIG. 4 is a diagram of illustrative clock-data phase alignment circuitry in accordance with an embodiment.

FIG. 4 is a diagram of illustrative clock-data phase alignment circuitry in accordance with an embodiment. As shown, the clock-data phase alignment circuitry may include clock phase adjustment circuitry 410, clock distribution network 430, replica clock distribution network 420, and storage circuits such as registers 440, 449, etc. In some embodiment storage circuits may be formed using other storage circuits such as latches, random-access memory (RAM), shift register logic (SRL), first-in first-out (FIFO) circuits, or other memory elements.

A clock distribution network such as clock distribution network 430 may include wired connections and buffers that allow to distribute a clock signal with predictable delay and minimal skew to clocked elements (e.g., registers or flip-flops, RAMS, etc.) in a circuit. Thus, the clock signal that is propagated through clock distribution network 430 arrives with a minimal difference in time at all registers 440 . . . 449.

A clock distribution network is sometimes also referred to as a clock tree. A clock distribution network may have an input, which is sometimes also referred to as a root, and a plurality of outputs, which are sometimes also referred to as leaves. The paths from the root to the leaves is sometimes also referred to as branches.

The clock-data phase alignment circuitry may receive a differential clock signal that includes clock signals CLK_P and CLK_N that are complementary to each other and (N+1) data signals D_0 . . . D_N. If desired, data signals D_0 . . . D_N may be differential signals, i.e., each of data signals D_0 . . . D_N may have a first and a second component that are complementary to each other. As an example, a first component of signal D_0 may have a rising edge when the second component of signal D_0 has a falling edge and vice versa. Together, the first and second components form an eye-diagram, and the capture of either of the first and second components samples the corresponding data signal. As shown in FIG. 4, only the positive component of data signal D_0 reaches the data input of register 440, and only the positive component of data signal D_N reaches the data input of register 449.

The time interval between condition changes of data signals D_0 . . . D_N (e.g., the time interval between a positive edge and a negative edge of the first component of data signal D_0) is sometimes also referred to as unit interval (UI), pulse time, bit period, or symbol duration time. In other words, a unit interval (UI), pulse time, or symbol duration time is the time taken in a data stream by each subsequent symbol or the time required to transmit one bit, which is equal to the time between a positive and a negative edge of clock signal CLK_P or CLK_N (i.e., half a clock period of clock signal CLK_P or CLK_N for clock signals with a 50/50 duty cycle).

The clock-data phase alignment circuitry may receive clock signals CLK_P and CLK_N with clock phase adjustment circuitry 410. Clock phase adjustment circuitry 410 may propagate one of the clock signals CLK_P and CLK_N (e.g., CLK_P) to clock distribution network 430. Clock distribution network 430 may propagate the clock signal through at least one clock buffer and provide a delayed first clock signal CLK_MID_J to register 440. Clock distribution network 430 may provide the same delayed first clock signal CLK_MID_J or another instance of the delayed first clock signal CLK_MID_I to register 449. Similarly, clock distribution network 430 may provide the same delayed first clock signal CLK_MID_J (or CLK_MID_I) or another instance of the delayed first clock signal CLK_MID_K to replica clock distribution network 420.

The delayed first clock signals CLK_MID_I, CLK_MID_J, and CLK_MID_K may be phase shifted by half a unit interval compared to data signals D_0 . . . D_N, thereby enabling the sampling of data signals D_0 . . . D_N in registers 440 . . . 449, respectively, based on clock edges (e.g., upon a rising edge, a falling edge, or a rising and a falling edge).

The replica clock distribution network 420 may be coupled between clock distribution network 430 and clock phase adjustment circuitry 410. Replica clock distribution network 420 may include a copy of a subset of branches of clock distribution network 430 (e.g., replica clock distribution network 420 may replicate one branch of clock distribution network 430). If desired, replica clock distribution network 420 may include a complete copy of clock distribution network 430.

Replica clock distribution network 420 may receive the delayed first clock signal (e.g., delayed first clock signal CLK_MID_K) and propagate the delayed first clock signal through at least one second clock buffer to provide a further delayed first clock signal to clock phase adjustment circuitry 410.

Figure 5A:
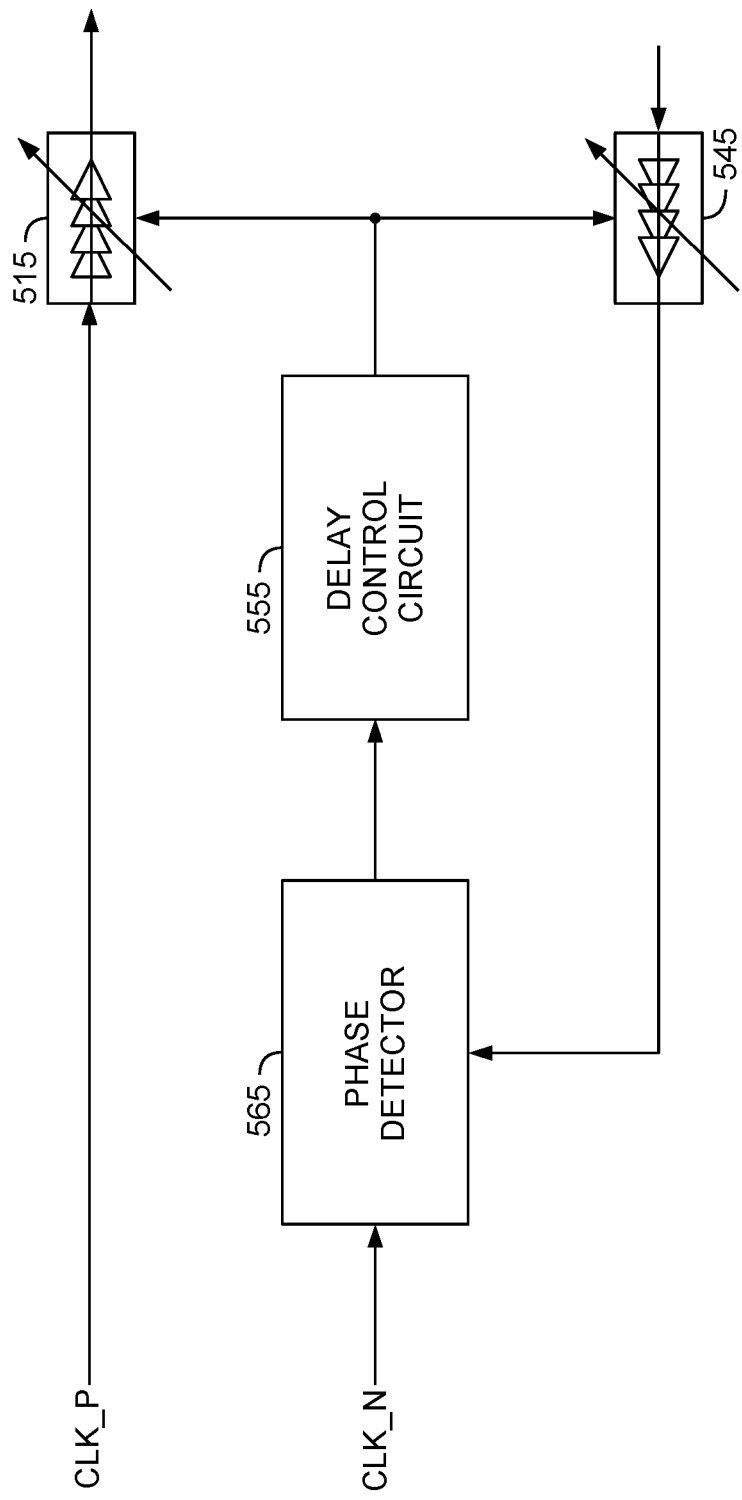
FIG. 5A is a diagram of illustrative clock phase adjustment circuitry in accordance with an embodiment.

FIG. 5A is a diagram of illustrative clock phase adjustment circuitry (e.g., clock phase adjustment circuitry 410 of FIG. 4) in accordance with an embodiment. As shown, the clock phase adjustment circuitry may include phase detector 565, delay control circuit 555, and adjustable delay circuits 515 and 545.

Adjustable delay circuit 515 may receive one of the clock signals CLK_P and CLK_N (e.g., CLK_P) and delay the clock signal as directed by delay control circuit 555 before providing the clock signal through a clock distribution network (e.g., clock distribution network 430 of FIG. 4) to a storage circuit and to a replica clock distribution network (e.g., replica clock distribution network 420 of FIG. 4).

If desired, delay control circuit 555 may adjust the delay of adjustable delay circuit 515 such that the total delay of the clock signal through the clock phase adjustment circuitry and the clock distribution network results in a phase shift of 90 degrees between the data signal and the clock signal. This delay may correspond to half a unit interval (UI) delay between the clock input and the clock port of the storage circuit, thereby resulting in a clocking event (i.e., a rising or falling edge of the clock signal) at the center of the eye of the data signal, and thus enabling the capture of the data signal with the storage circuit.

Consider the scenario in which the replica clock distribution network has the same delay as the clock distribution network and that delay control circuit 555 has adjusted adjustable delay circuit 545 to have the same delay as adjustable delay circuit 515. In this scenario, a clock signal (e.g., CLK_P) that is propagated through adjustable delay circuit 515, the clock distribution network, the replica clock distribution network, and adjustable delay circuit 545 arrives at phase detector 565 with a phase shift of 180 degrees relative to the same clock signal (e.g., CLK_P) at the clock input, which may correspond to one unit interval (UI) delay between the clock input and phase detector 565. In other words, the delayed clock signal which is sometimes also referred to as the feedback clock signal or the feedback signal (e.g., CLK_P) arrives in phase with the complementary clock signal (e.g., CLK_N), which phase detector 565 may use as a reference signal.

Phase detector 565 may detect a phase difference between the reference signal (e.g., CLK_N) and the feedback clock signal (e.g., CLK_P), generate a corresponding control signal, and provide the control signal to delay control circuit 555. Delay control circuit 555 may adjust the delays of adjustable delay circuits 515 and 545 accordingly.

For example, if the reference signal arrives before the feedback signal, phase detector 565 may direct delay control circuit 555 to reduce the delays of adjustable delay circuits 515 and 545. In contrast, if the reference signal arrives after the feedback signal, phase detector 565 may direct delay control circuit 555 to increase the delays of adjustable delay circuits 515 and 545.

Figure 5B:
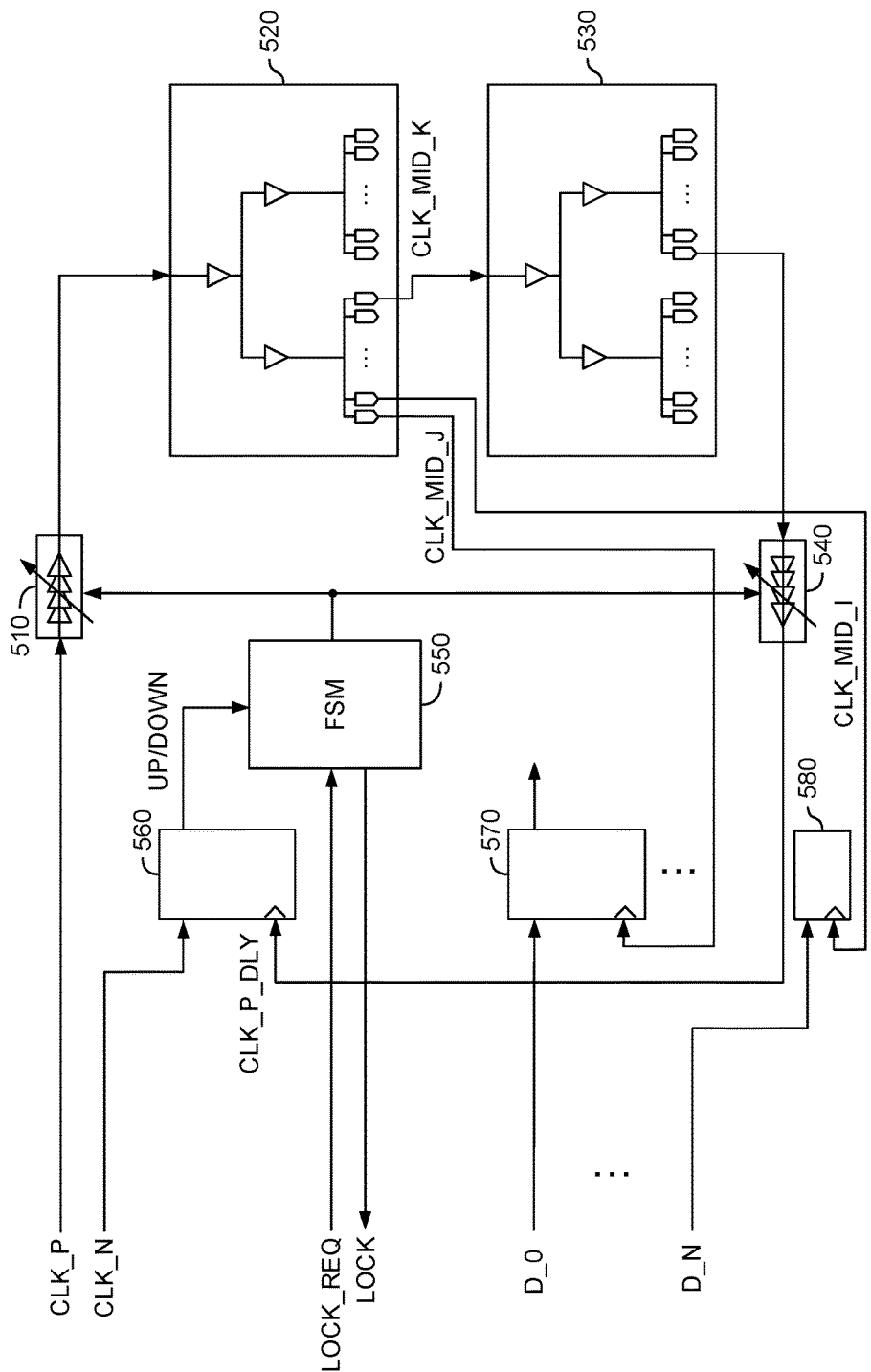
FIG. 5B is a diagram of illustrative clock phase adjustment circuitry coupled to first and second clock distribution networks in a clock-data phase alignment circuit in accordance with an embodiment.

An embodiment of a phase detector circuit 565 within illustrative clock phase adjustment circuitry coupled to first and second clock distribution networks (e.g., clock distribution network 430 and replica clock distribution network 420 of FIG. 4) in a clock-data phase alignment circuit in accordance with an embodiment is shown in FIG. 5B.

As shown in FIG. 5B, the clock-data phase alignment circuit may include register 560, finite state machine (FSM) 550, adjustable delay circuits 510, and 540, clock distribution network 520, replica clock distribution network 530, and storage circuits such as registers 570, 580, etc. The clock-data phase alignment circuitry may receive a differential clock signal that includes clock signals CLK_P and CLK_N that are complementary to each other and (N+1) data signals D_0 . . . D_N. If desired, data signals D_0 . . . D_N may be differential signals, i.e., each of data signals D_0 . . . D_N may have a first and a second component that are complementary to each other.

As shown, adjustable delay circuit 510 may receive clock signal CLK_P and delay the clock signal as directed by FSM 550. Clock distribution network 520 may propagate the clock signal from adjustable delay circuit 510 through at least one clock buffer and provide a delayed first clock signal CLK_MID_J to register 570. Clock distribution network 520 may provide the same delayed first clock signal CLK_MID_J or another instance of the delayed first clock signal CLK_MID_I to register 580.

Similarly, clock distribution network 520 may provide the same delayed first clock signal CLK_MID_J (or CLK_MID_I) or another instance of the delayed first clock signal CLK_MID_K to replica clock distribution network 530.

If desired, FSM 550 may adjust the delay of adjustable delay circuit 510 such that the delayed first clock signals CLK_MID_I, CLK_MID_J, and CLK_MID_K are phase shifted by 90 degrees relative to data signals D_0 . . . D_N and clock signal CLK_P. This delay may correspond to half a unit interval (UI) delay between CLK_P and the clock port of the storage circuit, thereby resulting in a clocking event (i.e., a rising or falling edge of the clock signals CLK_MID_I, CLK_MID_J, and CLK_MID_K) at the center of the eye of the respective data signal D_0 . . . D_N, and thus enabling the capture of the data signal with the registers 570 . . . 580.

Replica clock distribution network 530 may include a copy of a subset of branches of clock distribution network 520 (e.g., replica clock distribution network 530 may replicate one branch of clock distribution network 520). If desired, replica clock distribution network 530 may include a complete copy of clock distribution network 520.

Replica clock distribution network 530 may receive the delayed first clock signal (e.g., delayed first clock signal CLK_MID_K) and propagate the delayed first clock signal through at least one second clock buffer to provide a further delayed first clock signal to adjustable delay circuit 540.

Consider the scenario in which replica clock distribution network 530 has the same delay as clock distribution network 520 and that FSM 550 has adjusted adjustable delay circuit 540 to have the same delay as adjustable delay circuit 510. In this scenario, clock signal CLK_P that is propagated through adjustable delay circuit 510, clock distribution network 520, replica clock distribution network 530, and adjustable delay circuit 540 arrives at register 560 as signal CLK_P_DLY with a phase shift of 180 degrees relative to clock signal CLK_P, which may correspond to one unit interval (UI) delay. In other words, ideally the delayed clock signal CLK_P_DLY which is sometimes also referred to as the feedback clock signal or the feedback signal arrives in phase with the complementary clock signal CLK_N, which is sometimes also referred to as the reference clock signal or the reference signal.

Register 560 may act as a phase detector. Consider the scenario in which register 560 stores data at a rising edge event of clock signal CLK_P_DLY. In this scenario, if the feedback clock signal CLK_P_DLY arrives before the reference clock signal CLK_N, register 560 may store a logic '0', whereas if the feedback clock signal CLK_P_DLY arrives after the reference clock signal CLK_N, register 560 may store a logic '1'.

The signal stored in register 560 may thus serve as a control signal to FSM 550, which may adjust the delays of adjustable delay circuits 510 and 540 accordingly: If register 560 stores a logic '1', FSM 550 may reduce the adjusted delays of adjustable delay circuits 510 and 540. In contrast, if register 560 stores a logic '0', FSM 550 may increase the adjusted delays of adjustable delay circuits 510 and 540.

FSM 560 may include circuitry that prevents glitches when adjusting the delays of adjustable delay circuits 510 and 540. If desired, FSM 560 may receive a lock request signal and provide a status signal upon successful locking a predetermined phase shift between the reference clock signal CLK_N and the feedback clock signal CLK_P_DLY.

Figure 6:
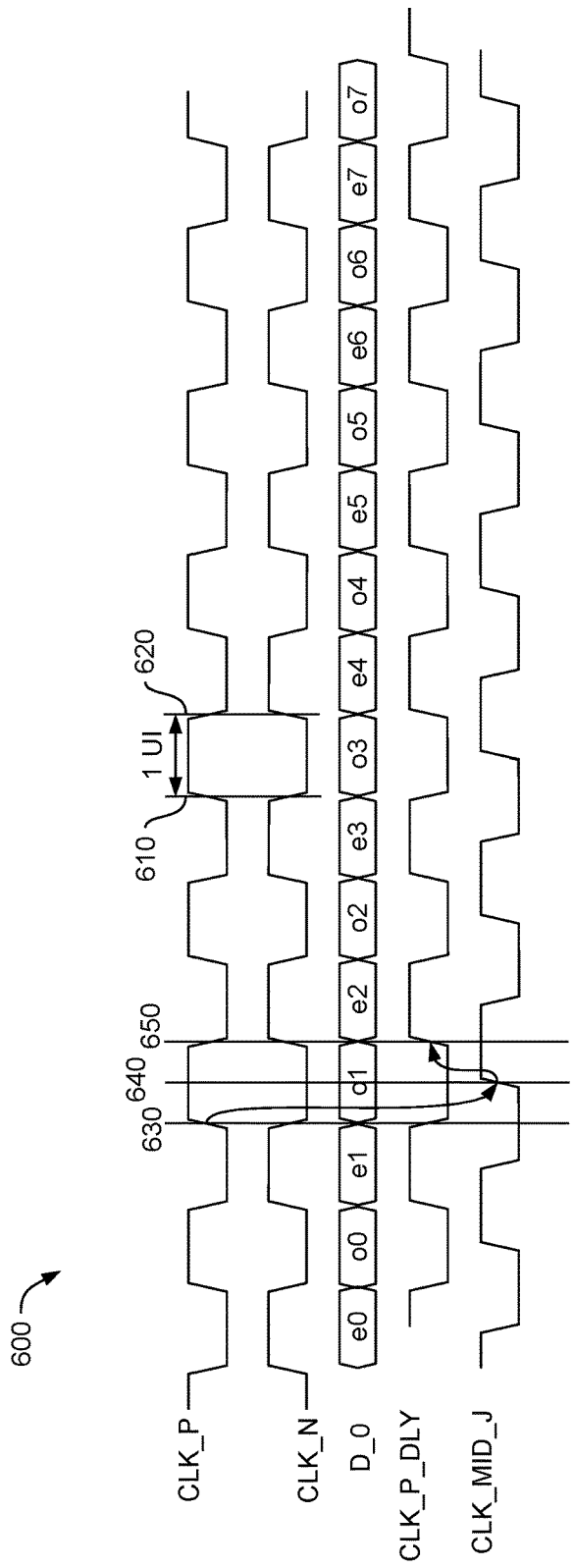
FIG. 6 is an illustrative timing diagram showing the phase relationships between the clock and data signals of FIG. 5B.

FIG. 6 is an illustrative timing diagram 600 showing the phase relationships between the clock and data signals of FIG. 5B. As shown in FIG. 5B, the clock-data phase alignment circuitry may receive clock signals CLK_P and CLK_N and data signal D_0. As shown in FIG. 6, data signal D_0 may be a differential signal that has a first and a second component that are complementary to each other. Together, the first and second component of data signal D_0 form an eye diagram.

Clock signals CLK_P and CLK_N are also complementary to each other and have a duty cycle of 50/50 (i.e., the time during which the clock signal is logic '1' is equal to the time during which the clock signal is logic '0'). As shown, the edges of the clock signals ClK_P and CLK_N are aligned with each other, and thus a unit interval may be the time between a rising edge of clock signal CLK_P at time 610 and a falling clock edge of clock signal CLK_P at time 620.

As shown in FIG. 5B, adjustable delay circuit 510 may receive clock signal CLK_P and delay the clock signal as directed by FSM 550. Clock distribution network 520 may propagate the clock signal from adjustable delay circuit 510 through at least one clock buffer and provide a delayed first clock signal CLK_MID_J. Clock signal CLK_MID_J may be delayed by half a unit interval (UI) delay relative to clock signal CLK_P. This is illustrated in FIG. 6 between time 630 and time 640.

At time 640, the rising edge of clock signal CLK_MID_J is in the center of the eye of data signal D_0 and thus enables the capture of data signal D_0 with register 570 of FIG. 5B.

As shown in FIG. 5B, further delaying clock signal CLK_MID_J (or another clock signal CLK_MID_K that has minimal skew relative to clock signal CLK_MID_J) in replica clock distribution network 530 and adjustable delay circuit 540 produces clock signal CLK_P_DLY at register 560. Clock signal CLK_P_DLY may have a phase shift of 180 degrees relative to clock signal CLK_P, which may correspond to one unit interval (UI) delay if replica clock distribution network 530 has the same delay as clock distribution network 520 and FSM 550 has adjusted adjustable delay circuit 540 to have the same delay as adjustable delay circuit 510. In other words, ideally the delayed clock signal CLK_P_DLY arrives at time 650 at register 560, which is in phase with clock signal CLK_N.

Thus, register 560 may act as a phase detector. If clock signal CLK_P_DLY arrives at register 560 early (i.e., in less than one unit delay, before time 650), register 560 may store a logic '0', whereas if clock signal CLK_P_DLY arrives at register 560 late (i.e., in more than one unit delay, after time 650), register 560 may store a logic '1'.

The signal stored in register 560 may thus serve as a control signal to FSM 550, which may adjust the delays of adjustable delay circuits 510 and 540 accordingly: If register 560 stores a logic '1', FSM 550 may reduce the adjusted delays of adjustable delay circuits 510 and 540 so that clock signal CLK_P_DLY arrives earlier. In contrast, if register 560 stores a logic '0', FSM 550 may increase the adjusted delays of adjustable delay circuits 510 and 540 so that clock signal CLK_P_DLY arrives later.

Figure 7:
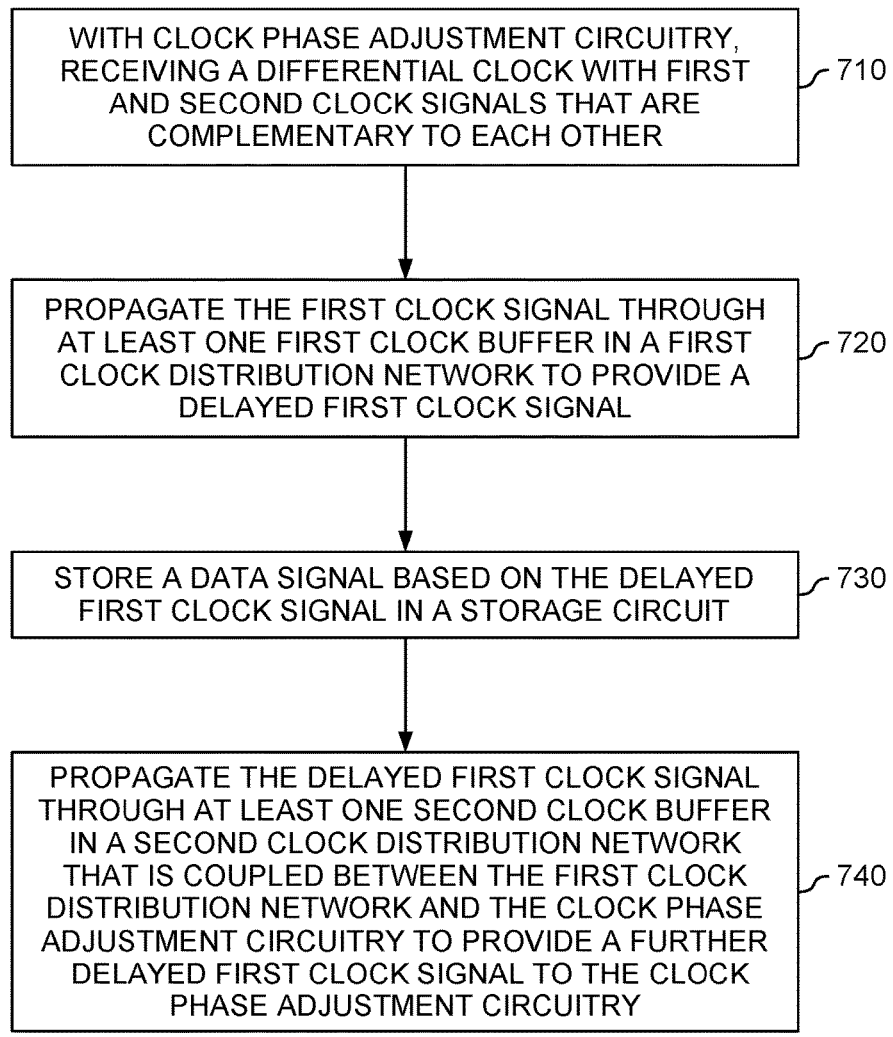
FIG. 7 is a diagram of a flow chart showing illustrative steps for operating clock-data phase alignment circuitry in accordance with an embodiment.

FIG. 7 is a diagram of a flow chart showing illustrative steps for operating clock-data phase alignment circuitry in accordance with an embodiment.

During step 710, clock phase adjustment circuitry may receive a differential clock with first and second clock signals that are complementary to each other. For example, clock phase adjustment circuitry 410 of FIG. 4 may receive clock signals CLK_P and CLK_N that are complementary to each other.

During step 720, the clock-data phase alignment circuitry may propagate the first clock signal through at least one first clock buffer in a first clock distribution network to provide a delayed first clock signal. For example, the clock-data phase alignment circuitry of FIG. 4 may propagate clock signal CLK_P through a clock buffer in clock distribution network 430.

During step 730, the clock-data phase alignment circuitry may store a data signal based on the delayed first clock signal in a storage circuit. For example, register 440 in FIG. 4 may store data signal D_0 based on the delayed first clock signal received through clock distribution network 430.

During step 740, the clock-data phase alignment circuitry may propagate the delayed first clock signal through at least one second clock buffer in a second clock distribution network that is coupled between the first clock distribution network and the clock phase adjustment circuitry to provide a further delayed first clock signal to the clock phase adjustment circuitry. For example, the clock-data phase alignment circuitry of FIG. 4 may propagate the delayed clock signal through at least one clock buffer in replica clock distribution network 420 that is coupled between clock distribution network 430 and clock phase adjustment circuitry 410.

The method and apparatus described herein may be incorporated into any suitable circuit or system of circuits. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), coarse-grained reconfigurable architectures (CGRAs), digital signal processing (DSP) circuits, application specific standard products (ASSPs), application specific integrated circuits (ASICs), just to name a few.

The integrated circuit described herein may be part of a data processing system that includes one or more of the following components: a processor; memory; I/O circuitry; and peripheral devices. The data processing system can be used in a wide variety of applications, such as computer networking, data networking, instrumentation, video processing, digital signal processing, or any suitable other application where the advantage of using a source synchronous interface circuit is desirable.

The integrated circuit may be configured to perform a variety of different logic functions. For example, the integrated circuit may be configured as a processor or controller that works in cooperation with a system processor. The integrated circuit may also be used as an arbiter for arbitrating access to a shared resource in the data processing system. In yet another example, the integrated circuit may be configured as an interface between a processor and one of the other components in the system. In one embodiment, the integrated circuit may be one of the families of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing.

The foregoing is merely illustrative of the principles of the embodiments and various modifications can be made by those skilled in the art without departing from the scope and spirit of the embodiments disclosed herein. The foregoing embodiments may be implemented individually or in any combination. The above described embodiments are presented for purposes of illustration and not of limitation, and the present invention is limited only by the claims that follow.

What is claimed is:

1. Clock-data phase alignment circuitry, comprising:
   clock phase adjustment circuitry that receives a differential clock with first and second clock signals that are complementary to each other;
   a first clock distribution network that receives the first clock signal from the clock phase adjustment circuitry and propagates the first clock signal through a first branch that has a first delay and includes at least one first clock buffer to provide a delayed first clock signal and through a second branch that is parallel to the first branch, has a second delay that is substantially equal to the first delay, and provides a delayed second clock signal;
   a first storage circuit that receives the delayed first clock signal and a first data signal and stores the first data signal based on the delayed first clock signal;
   a second storage circuit that receives the delayed second clock signal and a second data signal and stores the second data signal based on the delayed second clock signal; and
   a second clock distribution network coupled between the first clock distribution network and the clock phase adjustment circuitry, wherein the second clock distribution network receives the delayed first clock signal and propagates the delayed first clock signal through at least one second clock buffer to provide a further delayed first clock signal to the clock phase adjustment circuitry, wherein the first clock distribution network and the second clock distribution network reside externally and separately from the clock phase adjustment circuitry.

2. The clock-data phase alignment circuitry of claim 1, wherein the second clock distribution network replicates at least a branch of the first clock distribution network.

3. The clock-data phase alignment circuitry of claim 1, wherein each of the at least first and second clock buffers have a delay of less than half a unit interval (UI).

4. The clock-data phase alignment circuitry of claim 1, wherein the clock phase adjustment circuitry further comprises:
   a first adjustable delay circuit that delays the first clock signal by a first adjusted delay; and
   a second adjustable delay circuit that delays the further delayed first clock signal by a second adjusted delay to provide a feedback clock signal.

5. The clock-data phase alignment circuitry of claim 4, wherein the clock phase adjustment circuitry further comprises:
   a phase detector that provides a control signal based on a phase difference between the second clock signal and the feedback clock signal.

6. The clock-data phase alignment circuitry of claim 5, wherein the clock phase adjustment circuitry further comprises:
   a delay control circuit that adjusts the first and second adjusted delays of the first and second adjustable delay circuits respectively based on the control signal.

7. The clock-data phase alignment circuitry of claim 5, wherein the phase detector further comprises:
   a register that provides the control signal by storing the second clock signal based on the feedback signal.

8. The clock-data phase alignment circuitry of claim 7, wherein the control signal is logic '0' to indicate a desired delay increase and logic '1' to indicate a desired delay decrease.

9. A clock-data phase alignment circuit in an integrated circuit, comprising:
   a clock input that receives a differential clock signal having first and second clock signals;
   a data input that receives a data signal;
   a first clock distribution circuit with a first branch and a second branch that is parallel to the first branch and has substantially the same delay as the first branch, and wherein the first and second branches convey the first clock signal to provide a sampling clock signal;
   a second clock distribution circuit with a third branch that is a replica of the first branch, and conveys the sampling clock signal to provide a feedback clock signal;
   a clock phase adjustment circuit that controls a predetermined phase shift between the sampling clock signal and the data signal based on the first and second clock signals and the feedback clock signal, wherein the first clock distribution circuit receives a clock signal from the clock phase adjustment circuitry and the second clock distribution circuit provides a delay clock signal to the clock phase adjustment circuit, and wherein the first clock distribution network and the second clock distribution network reside outside of the clock phase adjustment circuitry; and
   a storage circuit that receives the data signal from the data input and the sampling clock signal from the first clock distribution circuit and stores the data signal based on the sampling clock signal.

10. The clock-data phase alignment circuit of claim 9, wherein each of the first and third branches has a respective delay of less than one half of a unit interval (UI).

11. The clock-data phase alignment circuit of claim 9, further comprising:
    at least one clock buffer in the first branch; and
    at least one other clock buffer in the third branch.

12. The clock-data phase alignment circuit of claim 9, wherein the clock phase adjustment circuit further comprises:
    a first adjustable delay circuit that delays the first clock signal by a first adjusted delay; and
    a second adjustable delay circuit that delays the feedback clock signal by a second adjusted delay.

13. The clock-data phase alignment circuit of claim 12, wherein the clock phase adjustment circuit further comprises:
    a phase detector circuit that generates a phase adjustment signal based on a detected phase difference between the second clock signal and the feedback clock signal delayed by the second adjusted delay; and
    a delay control circuit that generates a control signal to adjust the first and second adjusted delays based on the phase adjustment signal.

14. A method for operating clock alignment circuitry, comprising:
    receiving, with clock phase adjustment circuitry, a differential clock having first and second clock signals that are complementary to each other;
    propagating the first clock signal from the clock phase adjustment circuitry through a first branch that has a first delay and includes at least one first clock buffer in a first clock distribution network to provide a delayed first clock signal;

propagating the first clock signal through a second branch that is parallel to the first branch, includes a same number of clock buffers as the first branch to generate a second delay that is substantially equal to the first delay, and provides a delayed second clock signal;

storing a first data signal based on the delayed first clock signal in a first storage circuit;

storing a second data signal based on the delayed second clock signal in a second storage circuit; and propagating the delayed first clock signal through at least one second clock buffer in a second clock distribution network that is coupled between the first clock distribution network and the clock phase adjustment circuitry to provide a further delayed first clock signal to the clock phase adjustment circuitry.

15. The method of claim 14, further comprising:

delaying the delayed first clock signal in the first clock distribution network by less than half a unit interval (UI) relative to the first clock signal; and delaying the further delayed first clock signal in the second clock distribution network by less than half a unit interval (UI) relative to the delayed first clock signal.

16. The method of claim 14, further comprising:

using a first adjustable delay circuit in the clock phase adjustment circuitry to delay the first clock signal by a first adjusted delay; and using a second adjustable delay circuit in the clock phase adjustment circuitry to delay the further delayed first clock signal by a second adjusted delay to provide a feedback clock signal.

17. The method of claim 16, further comprising:

detecting a phase difference between the second clock signal and the feedback clock signal; and generating a control signal based on the phase difference.

18. The method of claim 17, further comprising:

adjusting the first and second adjusted delays of the first and second adjustable delay circuits, respectively, based on the control signal.

19. The method of claim 17, further comprising:

generating the control signal by storing the second clock signal in a register based on the feedback signal.

20. The method of claim 19, further comprising:

storing a logic '0' in the register to indicate a desired delay increase in the first and second adjustable delay circuits; and storing a logic '1' in the register to indicate a desired delay decrease in the first and second adjustable delay circuits.

* * * * *